(12) United States Patent
Ganghofer et al.

(10) Patent No.: US 9,809,198 B2
(45) Date of Patent: Nov. 7, 2017

(54) MOTOR VEHICLE AND REFLECTOR FOR A MOTOR VEHICLE

(71) Applicant: DIEHL DEFENCE GMBH & CO. KG, Ueberlingen (DE)

(72) Inventors: Andreas Ganghofer, Roethenbach (DE); Markus Baehr, Goessweinstein (DE)

(73) Assignee: DIEHL DEFENCE GMBH & CO. KG, Ueberlingen (DE)

( * ) Notice: Subject to any disclaimer, the term of this patent is extended or adjusted under 35 U.S.C. 154(b) by 337 days.

(21) Appl. No.: 14/723,685

(22) Filed: May 28, 2015

(65) Prior Publication Data

US 2015/0343994 A1 Dec. 3, 2015

(30) Foreign Application Priority Data

May 28, 2014 (DE) .................. 10 2014 008 216

(51) Int. Cl.
*B60L 1/00* (2006.01)
*B60R 99/00* (2009.01)
*H05K 9/00* (2006.01)

(52) U.S. Cl.
CPC ........... *B60R 99/00* (2013.01); *H05K 9/0015* (2013.01)

(58) Field of Classification Search
CPC .............................. H05K 9/0015; B60R 99/00
USPC ........................................................ 307/10.1
See application file for complete search history.

(56) References Cited

U.S. PATENT DOCUMENTS

| | | | |
|---|---|---|---|
| 4,308,417 A | 12/1981 | Martin | |
| 4,997,993 A | 3/1991 | Halversen | |
| 2006/0061470 A1* | 3/2006 | Hofbeck | B60R 21/01534 340/553 |
| 2009/0092284 A1* | 4/2009 | Breed | B60J 10/00 382/103 |
| 2012/0089299 A1* | 4/2012 | Breed | B60C 11/24 701/36 |
| 2013/0155532 A1* | 6/2013 | Kuhnke | F41H 5/266 359/833 |

FOREIGN PATENT DOCUMENTS

DE 3022154 A1 1/1981
DE 4221479 A1 1/1994

OTHER PUBLICATIONS

Diehl BGT Defence, "White paper on HPEM Technology", Jun. 2013, pp. 1-14.

(Continued)

*Primary Examiner* — Jared Fureman
*Assistant Examiner* — Duc M Pham
(74) *Attorney, Agent, or Firm* — Laurence A. Greenberg; Werner H. Stemer; Ralph E. Locher

(57) ABSTRACT

A motor vehicle has a body with an opening that can be closed by a preferably pivotable cover and a box-shaped metallic reflector that is open towards the opening for receiving an HPEM source and that is reversibly insertable into the opening. The reflector is connected to the body by an earth connection following insertion of the reflector. The earth connection is implemented by a brush strip containing fibers of a conductive material that connects the box-shaped reflector to the body circumferentially on all sides in the region of the opening.

20 Claims, 3 Drawing Sheets

(56) References Cited

OTHER PUBLICATIONS

Diehl Defence, "HPEMcarStop Non-violent system for selective stopping of vehicles in dynamic scenarios", Apr. 30, 2013 (Apr. 30, 2013), pp. 1-4, XP055222416, 90552 Rothenbach an der Pegnitz, DE, found on the Internet Oct. 20, 2015: http://www.diehl.com/fileadmin/diehl-defence/user_upload/flyer/HPEMcarStop_Flyer.pdf.

Dr D V Giri et al.: "An Overview of High-Power Electromagnetic (HPEM) Radiating and Conducting Systems", Feb. 24, 2006 (Feb. 24, 2006), XP055222547, found on the internet Oct. 20, 2015: http://www.researchgate.net/publication/228681326_An_Overview_of_High-Power_Electromagnetic_%28HPEM%29_Radiating_and_Conducting_Systems/links/00463538859d7d96c00000.pdf?inViewer=true&padfJsDownload+true&disableCoverPage=true&origin=publication_detail.

* cited by examiner

MOTOR VEHICLE AND REFLECTOR FOR A MOTOR VEHICLE

CROSS-REFERENCE TO RELATED APPLICATION

This application claims the priority, under 35 U.S.C. §119, of German application DE 10 2014 008 216.4, filed May 28, 2014; the prior application is herewith incorporated by reference in its entirety.

BACKGROUND OF THE INVENTION

Field of the Invention

The invention relates to a motor vehicle having a body with an opening that can be closed by a preferably pivotable cover and a box-shaped metal reflector that can be reversibly inserted into the opening and that is open towards the opening for receiving an HPEM source. The reflector is connected to the body by an earth connection following insertion.

A high power electromagnetic (HPEM) source or an operational system of this type offers the possibility of directing targeted noise pulses in electronic systems in order to block their functionality in this way. By this, it is possible for example to deactivate IEDs, to stop vehicles by intervening in their electronics and similar. It is a system operating purely on the effect of an electromagnetic pulse with a high energy density that does not cause any permanent damage to the electronics.

For this it is known to dispose a mobile HPEM source in a vehicle. For this purpose a reflector housing the HPEM source is inserted into a suitable opening of the vehicle. A vehicle with a tailgate, for example in the form of an all-terrain sport utility vehicle (SUV), with a certain robustness and also occasional off-road capability is preferred here. The reflector is a metal housing that is closed on all sides and is only open on one side facing the opening, so that the HPEM source disposed in the reflector can radiate outwards with the cover or tailgate open. For the protection of the actual vehicle it is necessary to connect the reflector to the vehicle's earth, i.e. to couple it to the body by an earth connection. As continuous a contact as possible is required around the entire circumference of the reflector, which is sometimes difficult because of the spatially complex shape of the opening on the body side and the resulting shape differences to the reflector housing. If conductive elastic elements such as rubber seals are used for the earth connection, then the seals can be flexibly deployable but they can only compensate for relatively small spacing differences, so that a reliable earth connection is not always achieved, particularly in the case of a moving vehicle.

SUMMARY OF THE INVENTION

It is accordingly an object of the invention to provide a motor vehicle and a reflector for the motor vehicle that overcomes the above-mentioned disadvantages of the prior art devices of this general type, which enables a simple and robust connection of the inserted reflector to the body earth.

In order to solve this problem, with a motor vehicle of the above-mentioned type it is provided according to the invention that the earth connection is implemented by a brush strip containing fibers of a conductive material, which joins the box-shaped reflector to the body circumferentially on all sides in the region of the opening.

In order to implement the earth connection, according to the invention a brush strip containing conductive fibers is used, wherein preferably metal fibers, particularly stainless steel fibers, are used as fibers, but other conductive fiber materials can also be used, as long as they are in particular ozone resistant and are able to carry surface currents. The brush strip is, as will be discussed below, either fixed to the body or disposed on the reflector and extends to the respective other part to be contacted. The fibers are flexible and have a suitable length, so that it is possible with the brush strip to be able to bridge even larger spacings between the body and the reflector. The metal reflector is simply inserted into the opening, wherein the brush strip or the fibers are bent at the latest on reaching the insertion end position because the fibers have sufficient length and come into contact with the respective opposing part over a sufficient length, for example 20 to 30 mm, so as to contact the same electrically. Because the brush strip and hence the fiber band is disposed circumferentially, consequently a completely circumferential earth connection between the reflector and the body earth results. The earth connection is preferably implemented by a flexible and/or continuous and/or conducting and/or displaceable and/or rotatable ground connection or electrical connection.

According to a first alternative of the invention, the brush strip can be disposed on the body in the region of the opening in this case, wherein the fibers protruding into the opening contact the exterior of the inserted reflector. The brush strip can be electrically conductively connected to the body, for example by soldering or welding, by which the fibers are of course suitably in contact with the body. If the reflector is now inserted into the opening, then it is automatically pressed against the inward protruding fibers on insertion. The fibers are bent and on further insertion lie on the exterior of the reflector so as to contact the reflector electrically.

Alternatively, for disposing the brush strip on the body it is of course also conceivable to dispose the brush strip on the reflector, again for example by soldering or welding it on, wherein following insertion of the reflector the fibers protruding laterally from the reflector contact the body at contact surfaces provided in the region of the opening. With the configuration of the invention, the earth contact is only achieved shortly before or on reaching the insertion end position, since the brush strip is disposed in the region of the open end of the reflector and the contact points are provided in the region of the vehicle opening. Here too the function is comparable to the previously described embodiment, because on reaching the contact position the fibers, which are in contact with the contact points, are bent or folded here too and are in contact with the contact surfaces over a longer distance.

The reflector itself is preferably dimensioned such that it ends in the region of the opening and the opening can be closed by the cover with the reflector inserted. This also enables the reflector to be readily transported in the closed vehicle. The earth contact is not lost here, even in the event of greater vehicle movements, because as described with sufficient overlap length the fibers contact the respective counterpart and a continuous earth contact always results because of sufficiently high fiber density.

The length of the fibers should be at least 50 mm, in particular at least 100 mm, wherein the definitive fiber length is of course dependent on the spacing conditions between the reflector and the vehicle opening. It should be selected such that in any case a fold or overlap line of 2 to 3 cm results in the contact position. Because the reflector geometry, which is also ultimately selected in relation to the body opening, does not change, it is possible to also cut the fibers individually so that they can be shortened in regions of smaller spacing.

The fiber thickness should be less than 1 mm, in particular less than 0.5 mm, ideally less than 0.1 mm, so that the fibers are sufficiently flexible and fold readily but can also straighten again. The packing density can also be selected to be suitably high with relatively thin fibers. It is useful here if the fiber packing density is selected such that the air exchange between the interior of the reflector and the interior of the vehicle, i.e. the passenger compartment, is reduced or is as small as possible, so that for example any ozone formed when operating the HPEM source does not pass into the passenger compartment.

As described, the fibers are preferably made of metal, particularly stainless steel. However, fibers of different conductive metals or carbon nanotubes and similar are also conceivable.

Besides the motor vehicle, the invention also relates to a reflector for such a motor vehicle as described previously. The box-shaped reflector that is closed apart from one side is characterized in that it contains a circumferential brush strip disposed in the region of the open side and contains fibers of a conductive material, which is in electrical contact with the reflector. The reflector is thus provided with the brush strip that makes the earth connection with the insertion of the reflector in the vehicle.

The brush strip is preferably soldered or welded to the reflector or is otherwise electrically conductively connected in a form-fitting and/or material-fitting manner, wherein the fibers are contacted by the metallic reflector by this means. The fibers themselves have a length of at least 50 mm, in particular of at least 100 mm, with a preferred thickness ≤1 mm, in particular ≤0.5 mm.

The fibers are, as already described, preferably made of metal, in particular of stainless steel. They can, however, also be made of other sufficiently conductive materials.

Other features which are considered as characteristic for the invention are set forth in the appended claims.

Although the invention is illustrated and described herein as embodied in a motor vehicle and a reflector for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
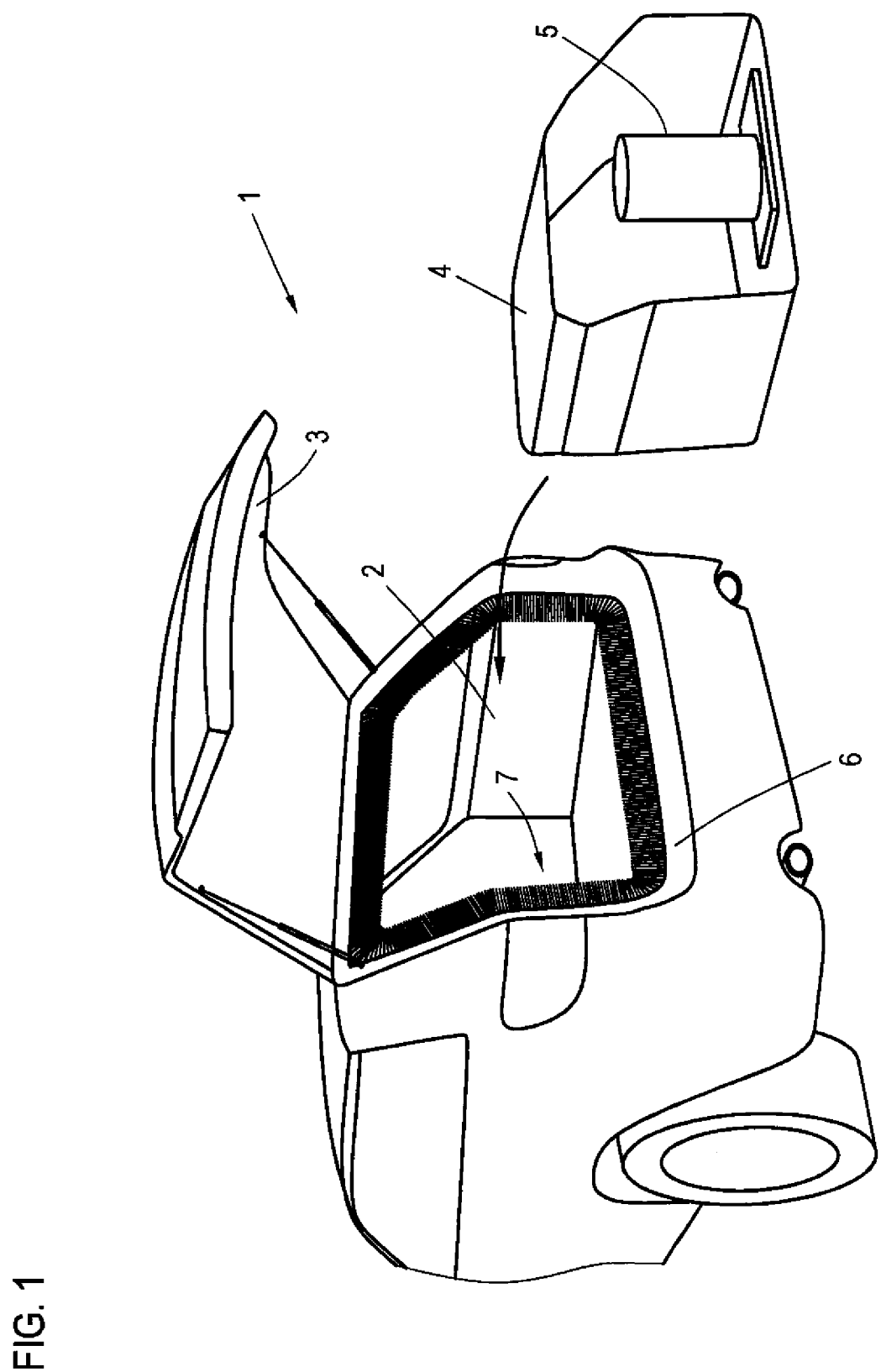
FIG. 1 is a diagrammatic, perspective view of a motor vehicle with a reflector not yet inserted according to the invention.

Referring now to the figures of the drawings in detail and first, particularly to FIG. 1 thereof, there is shown a motor vehicle 1 according to the invention, having an opening 2 at a rear that can be closed by a tailgate 3 in a conventional manner. The motor vehicle 1 is for example an SUV. However, it can also be a commercial vehicle, a transporter or an estate car, for example.

In the opening 2, i.e. the luggage compartment, a reflector 4 is to be inserted that forms a metallic housing for an HPEM source 5, which is only indicated here. The reflector 4 is closed on all sides apart from the front, via which the HPEM source 5 or a different electromagnetic source (radio transmitter, UWB, jammer, etc.) is inserted and which faces the opening 2 in the insertion position.

Figure 2:
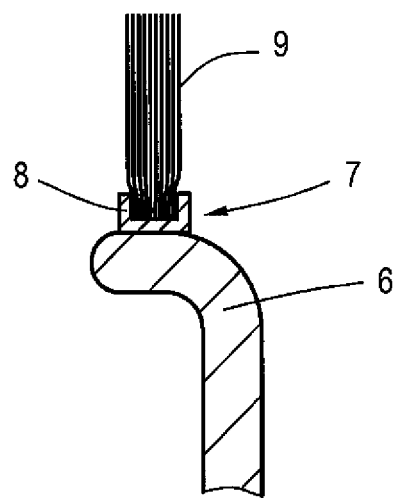
FIG. 2 is a diagrammatic, section view of a connecting region of fiber brush strips to the body without the reflector inserted.

In order to connect the reflector 4 by use of an earth connection to a body 6 of the vehicle (equipotential bonding), in the exemplary embodiment shown, there is a brush strip 7 fixed to the body, which—see for example FIG. 2—contains a strip mounting 8, by which it is for example soldered or welded to the body 6. A plurality of fibers 9 are accommodated in the strip mounting 8, being electrically conductively connected to the body 6 by the arrangement of the brush strip 7 on the body 6. The fibers 9 are metallic conductive fibers, for example stainless steel or copper fibers or for example fibers of conductive plastic. The fibers, which preferably have a fiber thickness of ≤0.5 mm, have a length of for example 8 to 10 cm. They protrude into the interior of the opening 2, as FIG. 1 clearly shows. The brush strip 7 is fully circumferentially disposed about the opening 2 and is electrically conductively connected to the body 6, so that consequently a circumferential earthing fiber band results, as FIG. 1 shows. In this case the reflector 4 can not only be used in a vehicle, but for example also in a stationary system.

Figure 3:
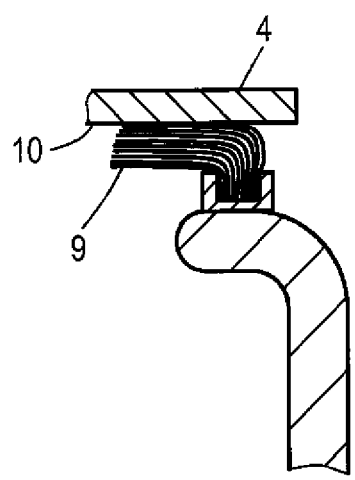
FIG. 3 is a sectional view of a fiber profile with an the reflector inserted.

If the reflector 4 is now inserted into the opening 2, then it is already forced against the fibers 9 that are protruding inwards into the opening 2 starting with the insertion, because the spacing of the fibers from one side to the opposite side or from the top to the bottom is smaller than the distances of respective surfaces of the reflector 4 from each other. This now inevitably means that the fibers 9 are folded, as shown by way of example in the schematic diagram according to FIG. 3. The fibers 9 thus bend and contact the exterior 10 of the reflector 4 or the respective reflector wall. Sufficient contact length results, so that in combination with the fiber length there is always a sufficient contact length even if the distance from the reflector wall to the brush strip is not the same throughout.

Because the brush strip 7 and hence the fiber band completely encircles the opening 2, a circumferential earth connection between the reflector 4 and the body 6 inevitably results, being automatically achieved on insertion of the reflector 4 into the opening 2. On reaching the end position, the earth connection is consequently made. Because of the overlap length of the fibers, the earth connection itself is then permanently ensured when the vehicle is travelling, because any relative displacements of the reflector to the body can be readily compensated. More importantly, operational capability is ensured even after a lengthy journey because the earth connection is made in all cases.

Figure 4:
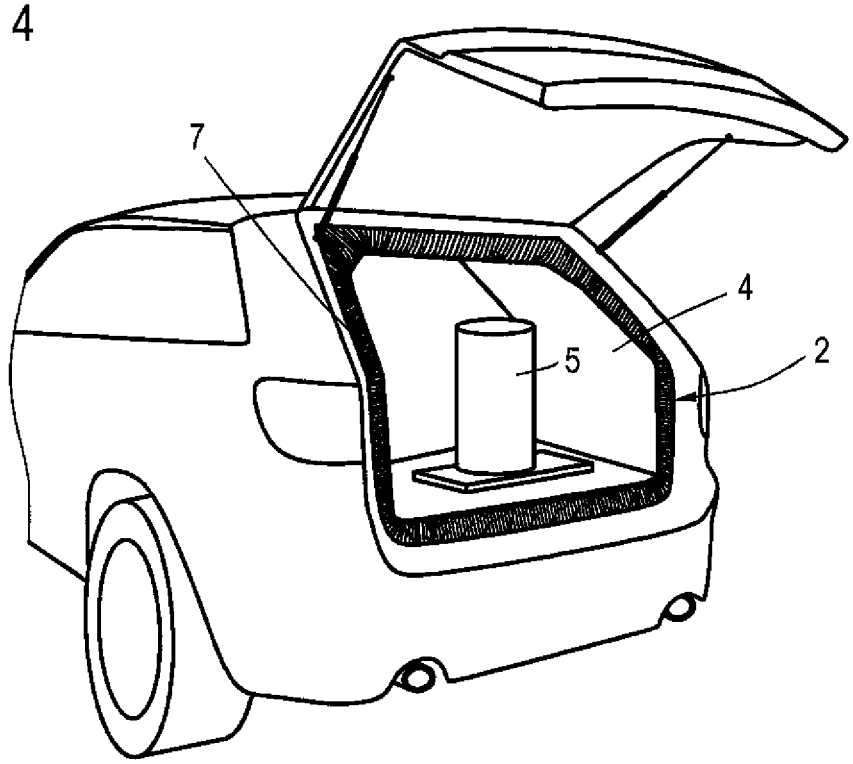
FIG. 4 is a perspective view of the motor vehicle of FIG. 1 with the reflector inserted therein.

FIG. 4 shows the reflector 4 as it is inserted into the opening 2 in the form of a schematic diagram. It is apparent that the fibers 7 are bent on all sides so that the earth connection is made on all sides.

Figure 5:
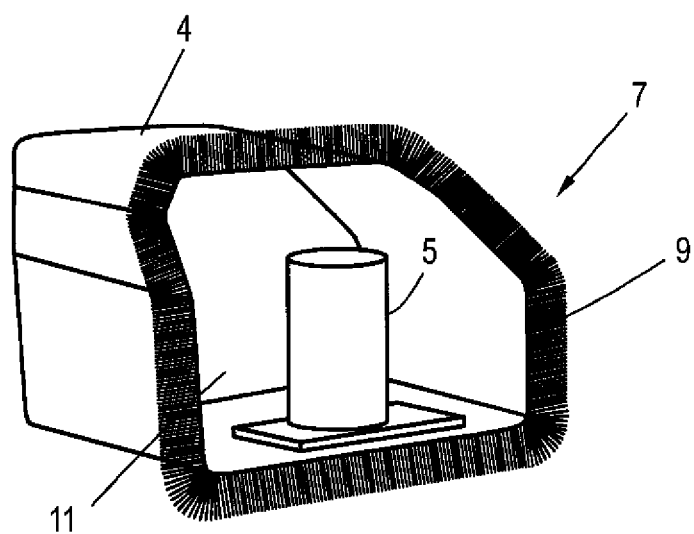
FIG. 5 is a perspective view of a second embodiment of the reflector with its circumferentially disposed brush strip.

With the previously described exemplary embodiment, the brush strip 7 is soldered or welded to the body and is thus a fixed component of the motor vehicle. FIG. 5 shows an alternative embodiment, in which the brush strip 7 is disposed on the reflector 4. The brush strip 7 is in this case again soldered or welded to the metallic reflector 4 by a suitable conductive brush mounting 8, so that the fibers 9 are suitably contacted. The brush strip 7 also extends completely around the opening of the reflector, so that again a circumferential contact is possible with the insertion of the reflector 4 into the opening 2 of the motor vehicle 1. The brush strip 7 is located near the opening 11 of the reflector 4 in this case, because it has to again ensure the earth connection to the body 6 in the region of the opening 2 of the motor vehicle 1 in the insertion end position. Suitable contact surfaces are provided on the body for this, being contacted over a suitable contact length by the fibers 9, which are bent in this case too. The fibers 9 are, however, folded in the opposite direction here compared to the illustration according to FIG. 3, since the reflector 4 is inserted into the opening 2 and in this case the fibers 9 lie against the body 6.

It is apparent that when using the brush strip with the conductive fibers, it is possible to ensure a flexible, continuous and low-impedance earth connection of the reflector to be earthed, even if large spacings are to be covered and particularly if the spacings vary because of the geometry of the contact surfaces to be connected, which do not necessarily extend parallel to each other, as is the case in the exemplary embodiment shown with the motor vehicle opening having a complex geometry. Thus a separation of the radiation region and the adjacent protection region is achieved in a particularly efficient manner.

The following is a summary list of reference numerals and the corresponding structure used in the above description of the invention:
- 1 motor vehicle
- 2 opening
- 3 tailgate
- 4 reflector
- 5 HPEM source
- 6 body
- 7 brush tip
- 8 strip mounting
- 9 fiber
- 10 exterior
- 11 opening

The invention claimed is:

1. A motor vehicle, comprising:
   a body having an opening formed;
   a pivotable cover;
   a box-shaped metallic reflector being open towards said opening for receiving an HPEM source and being reversibly inserted into said opening, wherein following insertion of said box-shaped metallic reflector, said box-shaped metallic reflector being connected to said body by means of an earth connection, said pivitoable cover with said box-shaped metallic reflector closing said opening; and
   a brush strip implementing the earth connection, said brush strip having fibers made of a conductive material, which connects said box-shaped reflector to said body circumferentially on all sides in a region of said opening.

2. The motor vehicle according to claim 1, wherein said brush strip is disposed on said body in said region of the opening, and being soldered or welded, wherein said fibers protruding into said opening contact on an outer side of said box-shaped metallic reflector inserted in said opening.

3. The motor vehicle according to claim 1, wherein said brush strip is disposed on said box-shaped metallic reflector, by one of soldering or welding, wherein said fibers protruding laterally from said box-shaped metallic reflector contact said body on contact surfaces provided in said region of said opening following insertion of said box-shaped metallic reflector.

4. The motor vehicle according to claim 1, wherein said box-shaped metallic reflector is dimensioned such that said box-shaped metallic reflector ends in said region of said opening and said opening can be closed by means of said cover with said box-shaped metallic reflector inserted.

5. The motor vehicle according to claim 1, wherein said fibers have a length of at least 50 mm.

6. The motor vehicle according to claim 1, wherein said fibers have a thickness being ≤1 mm.

7. The motor vehicle according to claim 1, wherein said fibers have a fiber packing density selected such that an air exchange between an interior of said box-shaped metallic reflector and an interior of the motor vehicle is reduced.

8. The motor vehicle according to claim 1, wherein said fibers are made of metal.

9. The motor vehicle according to claim 1, wherein said opening being closed by means of said cover being a tailgate.

10. The motor vehicle according to claim 1, wherein said fibers have a length of at least 100 mm.

11. The motor vehicle according to claim 1, wherein said fibers are made from stainless steel.

12. The motor vehicle according to claim 1, wherein said fibers have a thickness being ≤0.5 mm.

13. A reflector for a motor vehicle, comprising:
   a box-shaped reflector body being closed except for one open side; and
   a circumferential brush strip containing fibers of a conductive material disposed in a region of said open side and in electrical contact with said box-shaped reflector body.

14. The reflector according to claim 13, wherein said brush strip is soldered or welded to said box-shaped reflector body.

15. The reflector according to claim 13, wherein said fibers have a length of at least 50 mm.

16. The reflector according to claim 13, wherein said fibers have a length of at least 100 mm.

17. The reflector according to claim 13, wherein said fibers have a fiber thickness being ≤1 mm.

18. The reflector according to claim 13, wherein said fibers have a fiber thickness being ≤0.5 mm.

19. The reflector according to claim 13, wherein said fibers are made from metal.

20. The reflector according to claim 13, wherein said fibers are made from stainless steel.

* * * * *